United States Patent [19]

Schweitzer, Jr.

[11] Patent Number: 4,794,329

[45] Date of Patent: Dec. 27, 1988

[54] CABLE MOUNTED CAPACITIVELY-COUPLED CIRCUIT CONDITION INDICATING DEVICE

[76] Inventor: Edmund O. Schweitzer, Jr., 2433 Center St., Northbrook, Ill. 60060

[21] Appl. No.: 845,592

[22] Filed: Mar. 28, 1986

[51] Int. Cl.⁴ .............. G01R 1/20; G01R 31/02; G08B 21/00

[52] U.S. Cl. ................. 324/127; 324/133; 324/522; 340/664

[58] Field of Search ............ 324/127, 133, 109, 156, 324/157, 522, 524, 555; 340/664

[56] References Cited

U.S. PATENT DOCUMENTS

| | | | |
|---|---|---|---|
| 2,190,143 | 2/1940 | Barnes et al. | 238/14.13 |
| 2,779,927 | 1/1957 | Rudge | 336/175 |
| 3,434,052 | 3/1969 | Fechant | 324/127 |
| 3,725,832 | 4/1973 | Schweitzer, Jr. | 336/96 |
| 3,969,671 | 7/1976 | Smith | 324/109 |
| 4,375,617 | 3/1983 | Schweitzer, Jr. | 324/133 |
| 4,424,512 | 1/1984 | Schweitzer, Jr. | 324/133 |
| 4,438,403 | 3/1984 | Schweitzer, Jr. | 324/133 |
| 4,456,873 | 6/1984 | Schweitzer, Jr. | 324/127 |

FOREIGN PATENT DOCUMENTS 991779  6/1951 France .
174259 10/1965 U.S.S.R. .

Primary Examiner—Ernest F. Karlsen
Attorney, Agent, or Firm—Lockwood, Alex, FitzGibbon & Cummings

[57] ABSTRACT

A device for indicating a circuit condition such as the occurrence of a fault current in a high voltage conductor from which the indicator device is suspended includes a housing having at the upper end thereof a pair of outwardly projecting cable engagement members. The engagement members are formed of a resilient insulating material and each include an outwardly projecting base portion and an inwardly projecting end portion which engages and holds the cable against the rear wall of the housing. Operating power for the indicator device is derived from the potential gradient of the electric field surrounding the conductor by means of a metallic plate positioned within the housing adjacent the conductor, and a metallic ring and electrically conductive coating within the lower end of the housing.

5 Claims, 4 Drawing Sheets

CABLE MOUNTED CAPACITIVELY-COUPLED CIRCUIT CONDITION INDICATING DEVICE

BACKGROUND OF THE INVENTION

The present invention is drrected generally to circuit condition indicating devices, and more particularly to a capacitively coupled cable-mounted indicating device having improved cable engaging and coupling means for use in conjunction with a high voltage cable.

It is frequently necessary to monitor one or more specific circuit conditions on the conductor of a high voltage cable to determine whether certain condition exist, such as the absence of voltage or the presence of a fault current. The high voltage present on the conductor requires that the indicator be suspended directly on the conductor without communicating power or signal lines, or other metallic connections which might present a shock hazard to linemen or others involved in the servicing of the cable. This necessitates that the indicator either be battery powered, or be powered directly from the conductor by means of electrostatic coupling to the electric field surrounding the conductor, or inductive coupling to the magnetic field accompanying current flow through the conductor. The electrostatic coupling method is most appropriate for monitoring high voltage power system cables, and it is to the efficient accomplishment of this method that the present invention is directed.

The use of electrostatic coupling to the conductor of a high voltage power transmission system requires that the indicator be positioned close to the conductor so that a sufficient and consistent coupling is obtained with the the electric field surrounding the conductor. A further requirement of such coupling is that the indicator be readily installable and removable on the cable, preferably by means of a conventional lineman's tool, so as to not add to the inherent shock hazard of high voltage systems. The monitoring device of the present invention provides an improved construction which satisfies these requirements.

To realize the potential gradient within the electric field surrounding the conductor necessary for powering the device circuitry prior cable-suspended circuit condition monitoring devices utilized one or more electrically conductive projecting members. Unfortunately, such projecting members provide a potential leakage path on the outer surface of the device housing, between the exposed member and the monitored cable, which acted as a shunt impedance to the circuitry of the device which could under certain circumstances prevent the device from receiving sufficient excitation from the electric field surrounding the conductor. The construction of the present invention completely avoids the need for such projecting appendages, thereby achieving a more reliable and more compact monitoring device for use on high voltage power distribution systems.

The construction of the monitoring device of the invention is particularly well adapted for detecting the occurrence of fault currents in a monitored high voltage conductor, as shown in the copending application of the present inventor entitled "Fault Indicator Having Improved Trip Inhibit Circuit", filed concurrently herewith, and will be shown in that context herein. However, it will be appreciated that the construction of the monitoring device is adaptable to other purposes, such as a loss of voltage indicator, as shown in the copending appleation of the present inventor entitled "Voltage Loss Detector", filed concurrently herewith, and also for providing indications of voltage levels in a conductor.

Accordingly, it is a general object of the present invention to provide a new and improved circuit condition monitoring device for mounting on the high voltage conductor of a power distribution system.

It is a more specific object of the present invention to provide a circuit condition indicating device having a improved cable mounting arrangement whereby the indicator can be readily installed on and removed from a monitored conductor.

It is another specific object of the present invention to provide a circuit condition indicating device having an improved electrostatic coupling arrangement for developing operating power from a conductor from which the device is suspended without the use of projecting electrically-conductive ground plane elements.

SUMMARY OF THE INVENTION

The invention is directed to a circuit condttion monitoring device adapted for mounting on a monitored conductor. The device includes a hollow non-electrically conductive housing, high impedance circuit means within the housing providing an output iddicative of the condition of the circuit, and mounting means at one end of the housing for securing the housing in close proximity to the conductor. First electrostatic coupling means within the housing adjacent the one end thereof provide a first coupling between the circuitry and the electric field surrounding conductor, and second electrostatic coupling means totally within the housing at the other end thereof provide a second coupling between the circuitry and the electric field.

The invention is further directed to a circuit condition monitoring device adapted for mounting on a monitored conductor, wherein the device includes a hollow non-electrically conductive housing, circuit means within the housing for providing the monitoring function, including electrostatic coupling means within the housing for the deriving operating power from the electric field surrounding the conductor. Mounting means comprising a pair of electrically non-conductive cable engaging members projecting from the one end of the housing, each of the members including a base portion extending outwardly from the housing and outwardly from the other engaging member, intermediate portions reversing back toward the housing and the other member, and end portions extending toward the housing, are provided for engaging the conductor whereby the cable is received between the end portions and urged against the one end of the housing.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
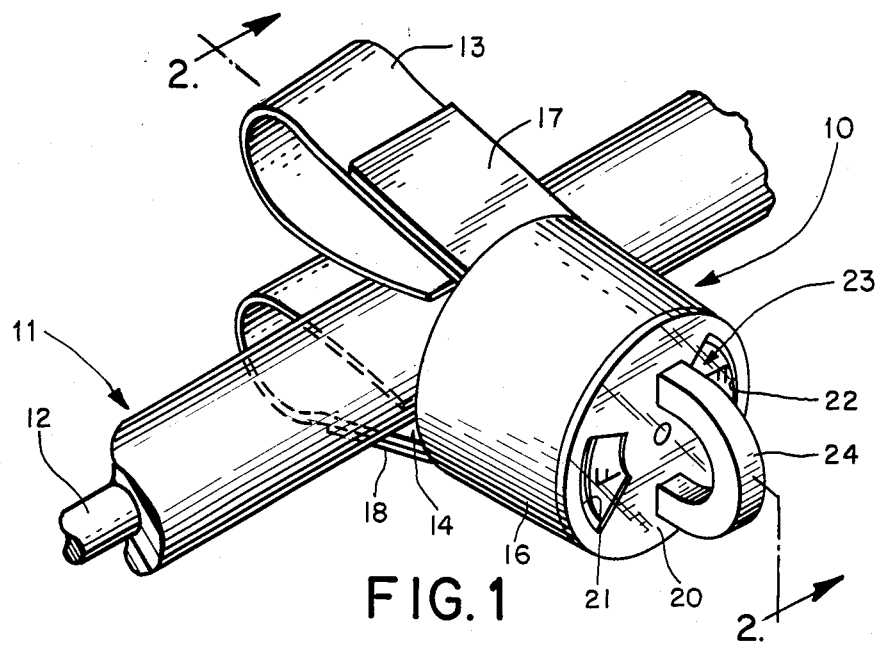
FIG. 1 is a perspective view of a circuit condition indicating device in the form of a fault indicator constructed in accordance with the invention installed on the high voltage cable of a power distribution system.
Figure 2:
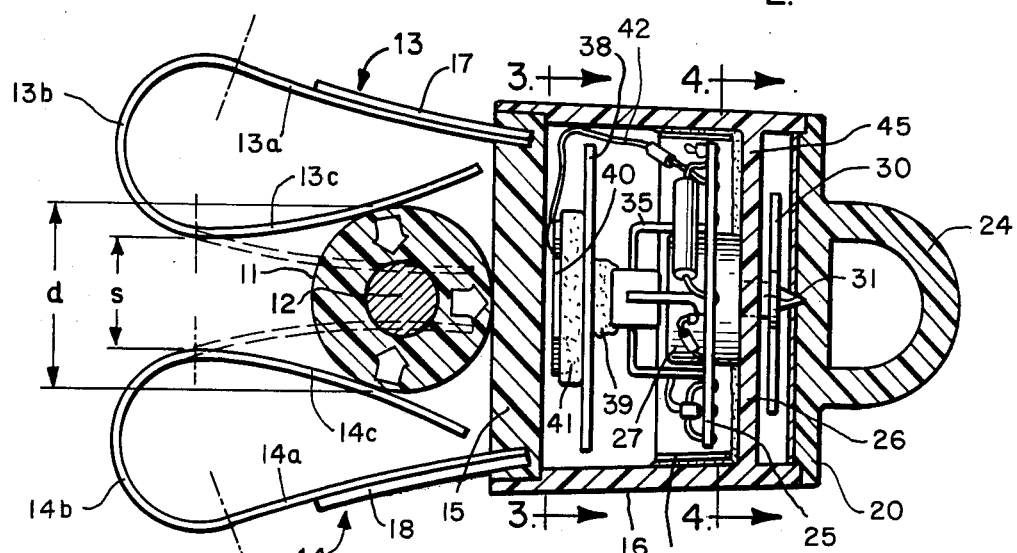
FIG. 2 is a cross-sectional view of the fault indicator taken along line 2—2 of FIG. 1.
Figure 3:
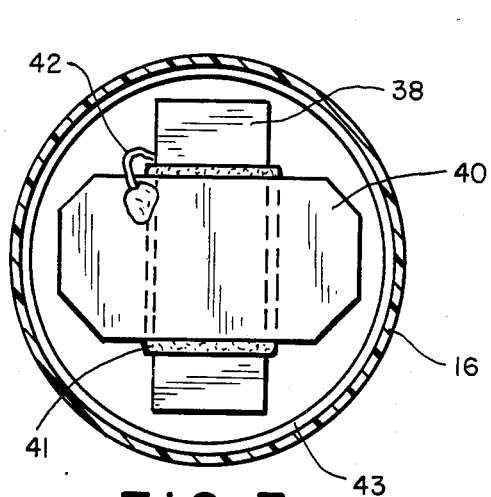
FIG. 3 is a cross-sectional view of the fault indicator taken along line 3—3 of FIG. 2.

Referring to the drawings, and particularly to FIGS. 1 and 2, a cable-mounted circuit condition monitoring device in the form of a fault indicator 10 constructed in accordance with the invention is shown mounted on a conventional high voltage cable 11 including an internal conductor 12. The detector 10 is secured by means of a pair of resilient retaining arms 13 and 14 which project outwardly from the rear wall 15 of an elongated generally cylindrical housing 16 of the fault indicator.

As shown in FIG. 2, the retaining arms may be anchored in the rear wall 15, and preferably include relatively straight base portions 13a and 14a which project outwardly of each other and away from the rear wall, intermediate portions 13b and 14b which turn inwardly toward each other and toward housing 16 approximately 180°, and end portions 13c and 14c which extend, in the undeflected position shown in phantom in FIG. 2, in a generally straight direction toward rear wall 15.

When the fault indicator 10 is installed on cable 11, the terminal portions 13c and 14c of retaining arms 13 and 14 are deflected outwardly as shown in FIG. 2, the resiliency of the deflected retaining arms causing a resultant inwardly-directed force to be applied to cable 11. To this end, it is necessary that the spacing s between the end portions, as shown in FIG. 2, be less than the diameter d of the cable. As a result of the inwardly directed resultant force, the cable is urged against the rear wall 15 of housing 16 and indicator 10 is secured in its operating position on the cable.

The etaining arms are preferably formed of a flexible UV-resistant acetal copolymer plastic material, such as CELCON (a trademark of Celanese Plastics Co., Chatham, New Jersey) or DELAN (a trademark of Dupont Corporation, Philadelphia, Pa.). The housing is preferably formed from a polycarbonate material, such as LEXAN (a trademark of General Electric Company, Schenectady, N.Y.), and the rear wall of the housing may comprise a layer of poxy material in which the retaing arms are embedded.

To assist retaining arms 13 and 14 in applying force to cable 11 a pair of stiffening members 17 and 18 may be provided in close association with the base portions 13a and 14a of the retaining arms. As shown in FIG. 2, these are preferably embedded in the rear wall 15 of housing 16, and may be formed of an electrically-insulating weather-resistant material such as epoxy or hardened plastic.

As shown to best advantage in FIG. 2, upon insertion of cable 11 between the retaining arms 13 and 14, the ends of the retaining arms are readily forced apart. This allows housing 16 to be conveniently pushed up against the cable during installation, and as the cable abuts the rear wall 15 of the housing the end portions of the retaining members push against the cable and maintain the cable in engagement.

To provide an indication of a fault occurrence, the fault indicator 10 described herein includes on the front wall 20 of housing 16 a pair of windows 21 and 22 through which an indicator flag assembly 23 provides a visible indication of the occurrence of a fault current. A handling loop 24 having ends anchored in the front wall extends from housing 16 to receive the hooked end of a lineman's tool to facilitate installation and removal of the indicator from cable 11.

Figure 4:
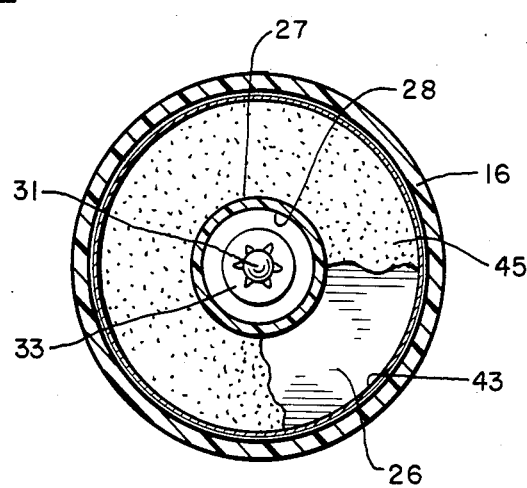
FIG. 4 is a cross-sectional view of the fault indicator taken along line 4—4 of FIG. 2.

The various circuit components of the fault indicator are mounted on a circuit board 25 contained within housing 16. An interior wall 26 is provided within the housing between circuit board 25 and the front wall 20. This wall includes a central hub portion 27 which includes a forwardly-facing recess 28 (FIG. 4).

Figure 5:
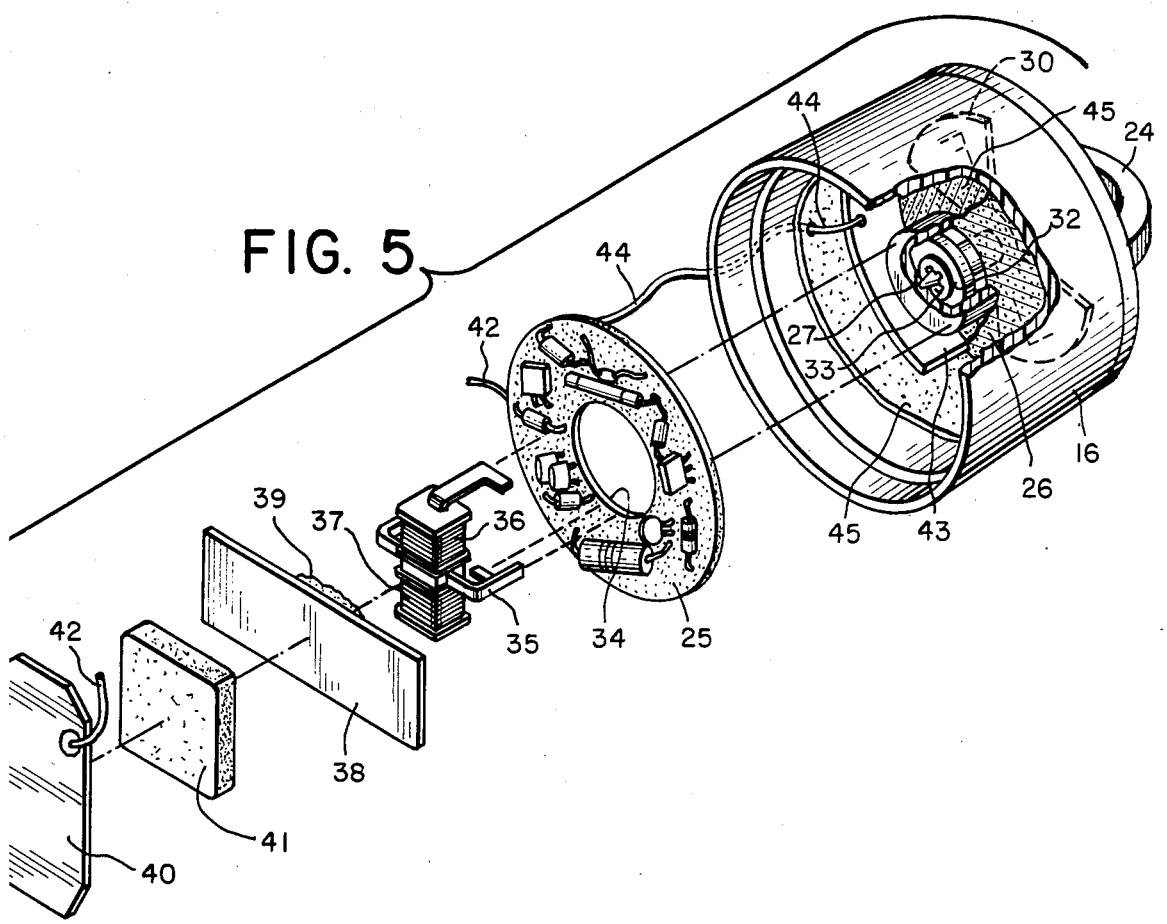
FIG. 5 is an exploded view of certain principal components of the fault indicator showing the internal construction thereof.
Figure 6:
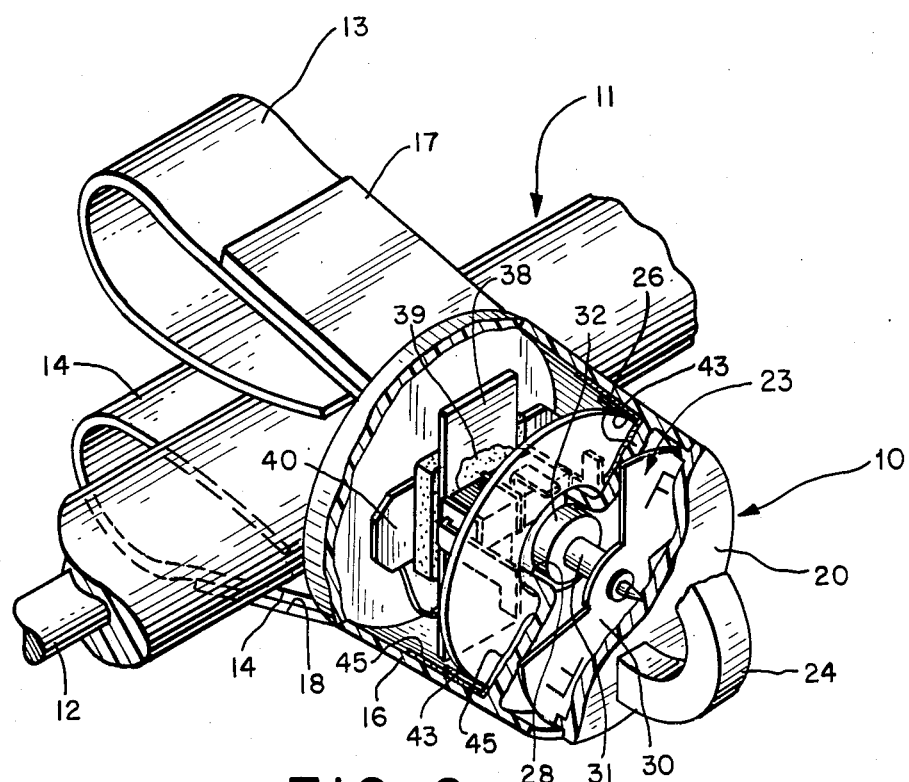
FIG. 6 is a perspective view of the fault indicator installed on the cable with the housing thereof partially broken away to illustrate the positioning of certain principal components of the fault indicator.

The indicator flag assembly 23 is contained within that portion of the housing interior formed between the interior wall 26 and the front wall 20 of housing 16. In particular, the flag indicator assembly 23 includes an indicator flag 30 connected by a shaft 31 to a disc-shaped flag actuator magnet 32. The forward end of shaft 31 is pivotably mounted along the axis of housing 16 to the front wall 20, and the rear end of shaft 31 is similarly mounted to interior wall 26 within recess 28 such that flag member 30 is free to rotate about the axis of housing 16. Fastening means in the form of a C-washer 33 may be provided to secure the flag actuator magnet 32 to shaft 31. As shown in FIGS. 5 and 6, circuit board 25 includes an aperture 34 through which the hub portion 27 of divider wall 26 is received. Thus, the hub portion serves as an indexing and securing means for the circuit board.

To provide for positioning of flag indicator 30 by the circuitry of fault indicator 10 indicator assembly 23 is provided with magnetic actuating means in the form of a generally cross-shaped magnetic pole piece 35. When this pole piece is positioned over hub 27 as shown in FIG. 6, the individual magnetic poles thereof are positioned at $\pi°$ intervals around and adjacent to the circumference of flag actuator magnet 32. A pair of magnetic windings 36 and 37 on pole piece 35 is energized by the circuitry of fault indicator 10 to condition the indicator assembly 23 to its reset and fault-indicating conditions.

To prevent the intense magnetic field accompanying a fault current in conductor 12 from undesirably magnetizing pole piece 35 the fault indicator includes a magnetic shield element 38 positioned within housing 16 between pole piece 35 and conductor 12. This shield may take the form of a metallic plate and may be secured to the magnetic windings 36 and 37 of the pole piece by a layer 39 of epoxy or similar material.

To provide a first electrostatic point to the electrid field surrounding conductor 12 fault indicator 10 includes a flat metallic plate 40 immediately behind the rear wall 15 of housing 16. This plate, which may be spaced and electrically isolated from magnetic shield 38 by a block of non-metallic non-conductive non-magnetic material 41 is connected to the circuitry of fault indicator 10 by a flexible conductor 42.

To provide a second pickup point to the electric field, fault indicator 10 includes on the inside surface of the cylindrical housing 16 an electrically conductive band 43 formed of a metallic material such as baass or steel. Where additional magnetic shielding is required for the components of the indicator steel is the preferred material for band 43, since it provides a significant degree of magnetic shielding. The band, which extends around a substantial portion of the inside circumference of housing 16 adjacent the rear surface of divider wall 26, is connected to the circuitry of the fault indicator 10 by a flexible conductor 44. Beneath band 43 the inside surface of housing 16 maybe provided with an electrically-conductive coating 45 which extends rearwardly of the ring, and forwardly of the ring over the rear surface of divider wall 26, to provide a greater degree of electrostatic coupling.

Figure 7:
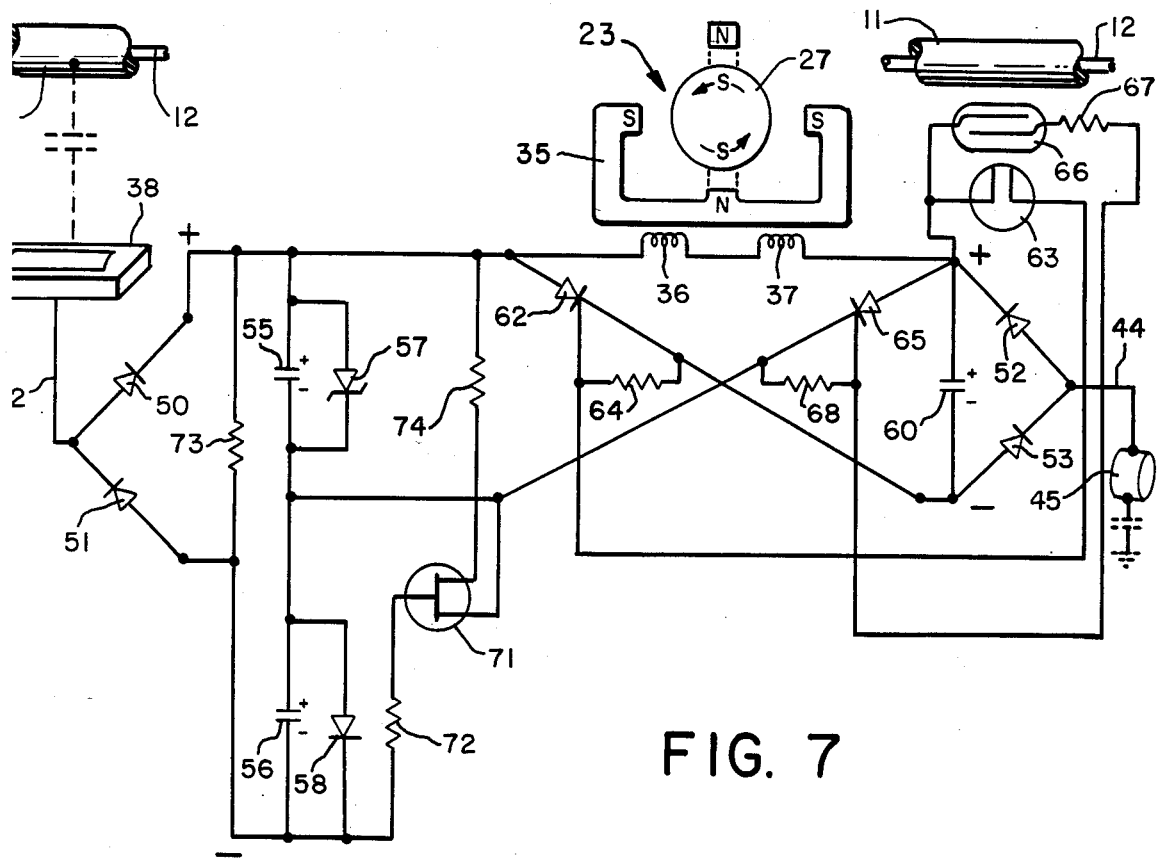
FIG. 7 is an electrical schematic diagram of the fault indicator shown in FIGS. 1-6.

Referring to FIG. 7, the circuitry of fault indicator 10 is seen to comprise a first rectifier network comprising a pair of rectifier diodes 50 and 51 connected to the capacitive pickup plate 38 through conductor 42. A second rectifier network comprising a pair of rectifier diodes 52 and 53 is connected through conductor 44 to the electrically conductive ring 43 and electrically conductive coating 45 provided on the inside surface of housing 16 to provide capacitive coupling to ground. Together, the two rectifier networks provide high input impedance eectification of the alternating current derived from the magnetic field surrounding the monitored conductor 12 of cable 11 by the two radially-spaced electrostatic pickup points to provide energization of the trip, reset and trip inhibit circuits of fault indicator 10.

The pulsating direct current developed by diodes 50 and 51 during normal current flow in conductor 12 is applied to a trip capacitor 55 and a trip inhibit capacitor 56 connected in series across the output terminals of the network. Th zener diode 57 connected across trip capacitor 55 limits the voltage developed across that capacitor to the threshold voltage of the zener diode, typically in the order of 50 volts, and a forward-biased diode 58 connected across trip inhibit capacitor 56 limits the voltage developed across that device during the charge cycle to the forward drop of the diode, typically in the order of 0.7 volts. The pulsating direct current developed by diodes 52 and 53 is applied to a reset capacitor 60 connected across the output of the second rectifier network, causing that capacitor to also be charged during normal current flow.

To provide for periodic reset of the fault indicator, capacitor 60 is periodically discharged through the series-connected windings 36 and 37 of flag indicator assembly 23. To this end, a silicon controlled rectifier 62 is periodically conditioned into conduction by the discharge of a neon lamp 63 in the gate circuit of the SCR upon the voltage across capacitor 60 exceeding a predetermined threshold level. The neon lamp, because of its relatively high threshold voltage, typically in the order of 60 volts, is particularly attractive as a threshold device. However, it will be appreciated that where desired other avalanche type devices, such as four-layer diodes, can be provided for this purpose. A resistor 64 completes the gate circuit.

Following the discharge of reset capacitor 60 through windings 36 and 37, the voltage across the capacitor drops, neon lamp 63 extinguishes, and SCR 62 ceases to conduct. Capacitor 60 then begins to recharge until the voltage the across reset capacitor 60 again reaches the threshold level of neon lamp 63 and conduction through SCR 62 accomplishes another reset cycle. The re etotopm rate of the reset cycle is dependent on the capacitance of reset capacitor 60 and the effective impedance of the charging circuit. In practice, the reset cycle may occur approximately every 2 minutes.

Upon occurrence of a fault current in conductor 12, trip capacitor 55 is caused to discharge in a reverse direction through windings 36 and 37 through a second silicon controlled rectifier (SCR) 65. This results from closure of reed switch contacts 66, which are positioned in close magnetic proximity to cable 11 and connected to the gate electrode of SCR 65 through a gate circuit comprising a series r sistor 67 and a resistor 68 to ground.

Trip capacitor 55 continues to discharge until the discharge current is no longer sufficient to maintain conduction through SCR 65. Magnetic pole piece 35 of flag indicator assembly 23 however remains in a magnetic polarity which maintains the indicator flag 40 thereof in a fault indicating position. Upon restoration of normal current in conductor 12, it remains for the reset circuit of reset capacitor 60 to remagnetize pole piece 35 so as to reposition flag indicator 30 to a reset-indicating position.

To prevent false fault indications by fault indicator 10 as a result of inrush current associated with initial powerup of the monitored conductor 12, the fault indicator includes the trip inhibit capacitor 56 and its associated inhibit circuitry for discharging trip capacitor 55 upon such initial powerup. In particular, the control electrodes of an enhanced FET-type transistor 71 are connected across trip inhibit capacitor 56 through a resistor 72. During normal operation the forward-bias of diode 57 present across capacitor 56 constitutes a reverse bias to transistor 71 which biases the transistor into cut-off. Upon loss of excitation trip capacitor 55 is caused to partially discharge through a resistor 73 into trip inhibit capacitor 56, causing the voltage across that device to reverse polarity and progressively increase in the reverse direction as the device is charged. Eventually the threshold voltage of transistor 71 is reached and the transistor is rendered conductive by the applied forward bias from capacitor 56, causing trip capacitor 55 to rapidly discharge through a resistor 74 and therefore be unavailable for providing trip current to windings 36 and 37 upon conduction by SCR 65. Thus, after loss of voltage in conductor 12, the fault indicator is non-responsive to a fault current which occurrs following the restoration of power in conductor 12, and does not become operative for this purpose until capacitor 55 has again been charged. This may in practice require several minutes.

The time required for the fault indicator to respond to a voltage loss depends on the relative capacitances of capacitor 55 and 56, the resistance of resistor 73, and the threshold voltage level of transistor 71, which may typically be in the order of 3.5 volts. Typically, a response time of 0.1 second is obtained, corresponding to approximately 6 alternating current cycles in a standard 60 hertz system.

The operation of indicator flag assembly 23 is illustrated in FIGS. 8-11. The indicator, which may be identical in construction and operation to that described in U.S. Pat. No. 4,495,489 of the present inventor, is seen to include the indicator flag 30, shaft 31 and flag actuator magnet 32, pole piece 35 and windings 36 and 37. The indicator flag includes two indicator segments 30a and 30b on either side of the axis of rotation which preferably each extend less than 90° around the axis of rotation.

Figure 8A:
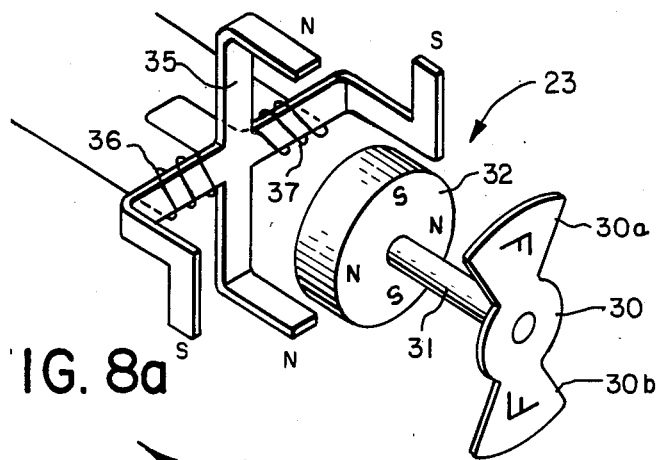
FIGS. 8a and 8b are diagrammatic views of certain principal indicator components of the fault indicator illustrated in FIGS. 1-6 showing the components in a reset state.
Figure 8B:
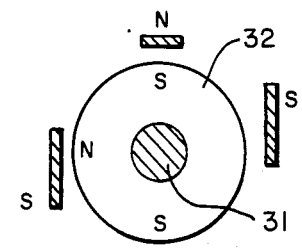
Figure 9A:
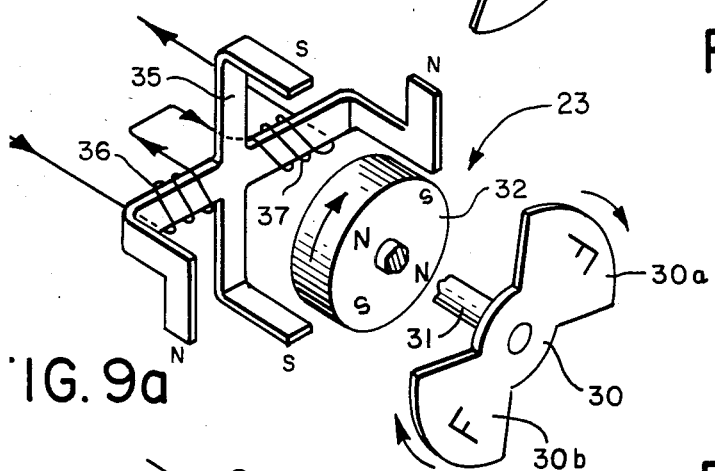
FIGS. 9a and 9b are diagrammatic views similar to FIGS. 8a and 8b, respectively, showing the indicator componets in transition between a reset state and a tripped state.
Figure 9B:
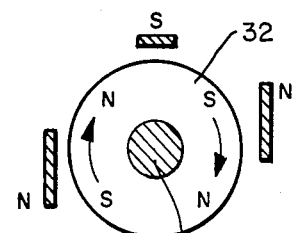
Figure 10A:
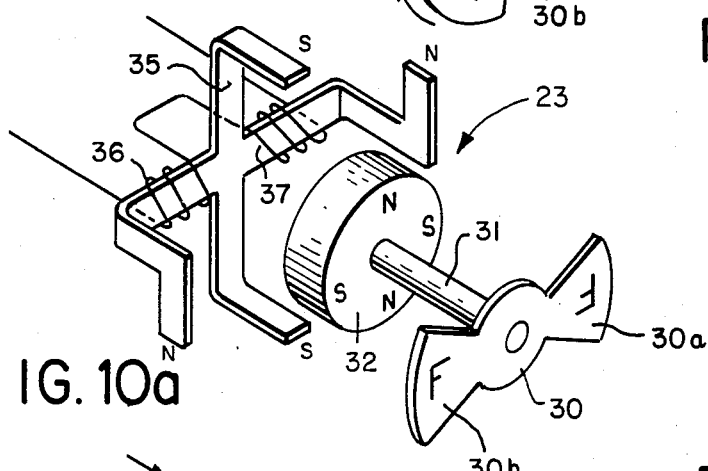
FIGS. 10a and 10b are diagrammatic views similar to FIGS. 8a and 8b, respectively, showing the indicator components in a tripped state.
Figure 10B:
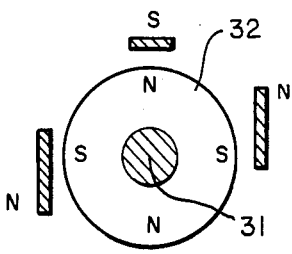

When aligned as shown in FIGS. 8a-8b the flag segments are masked and are not visible to the observer through windows 21 and 22. However, upon occurrence of a fault current, flag member 30 rotates 90° such that the indicator segments are positioned as shown in FIGS. 10a and 10b and are visible through the windows. The indicator segments are preferably colored red, or another highly visible color, to clearly indicate the occurrence of a fault current when viewed through the windows.

Actuation of flag member 30 between reset and fault indicating positions is accomplished by flag actuator magnet 32 which is rotatably coupled to the flag member by shaft 31. The shaft is maintained in alignment with the axis of indicator housing 16 by means of bearing surfaces in divider wall 26, which also provides a reset-indicating surface viewable through windows 21 and 22 when the indicator flag is in its reset position. This surface is preferably colored white, or some other color contrasting with the color of the indicator flag segments, to clearly indicate a reset condition when viewed through the windows.

Actuator magnet 32, which may be formed of a magnetic material having a high coercive force, such as ceramic, is formed to provide four magnetic poles of opposite polarity, with opposite polarities at 90° about the circumference of the magnet. Actuator magnet 32, and hence indicator flag 30, are biased to the position and magnetic polarities shown in FIGS. 13a and 13b when the fault indicator 10 is in a non-trip or reset condition by means of a generally cross-shaped magnetic pole piece 35, formed of a magnetic material having a relatively low coercive force, such as chrome steel. The pole piece includes four magnetic poles in magnetic communication with flag actuator magnet 32.

Upon loss of voltage in conductor 12, pole piece 35 is remagnetized to the magnetic polarities shown in FIGS. 9a-9b and 10a-10b by momentary energization of magnetic windings 36 and 37. As a result, the poles of flag actuator magnet 32 are repelled by adjacent like-polarity poles of the pole piece and the indicator flag is caused to rotate 90° to the indicating position shown in FIGS. 10a-10b. In this position, the red indicator segments 30a and 30b of the indicator flag 30 are visible through windows 21 and 22 and a lineman viewing the fault indicator is advised that a fault current has occurred in conductor 12.

Figure 11A:
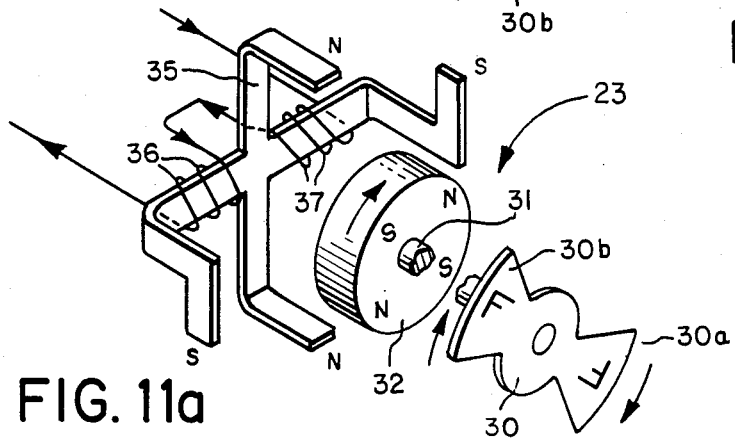
FIGS. 11a and 11b are diagrammatic views similar to FIGS. 8a and 8b, respectively, showing the indicator components in transition between a tripped state and a reset state.
Figure 11B:
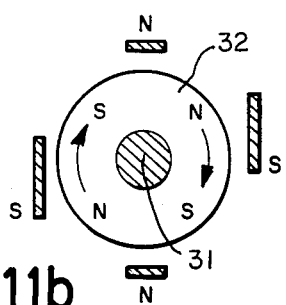

The indicator flag 30 remains in the fault-indicating position until the poles of pole piece 35 are subsequently remagnetized to the magnetic polarity shown in FIGS. 11a-11b by momentary application of a reset current to windings 36 and 37. This causes flag actuator magnet 32 to again be repelled by the adjacent poles of pole piece 35 so as to rotate indicator flag 30 to a vertical position, as shown in FIGS. 8a-8b.

Figure 12:
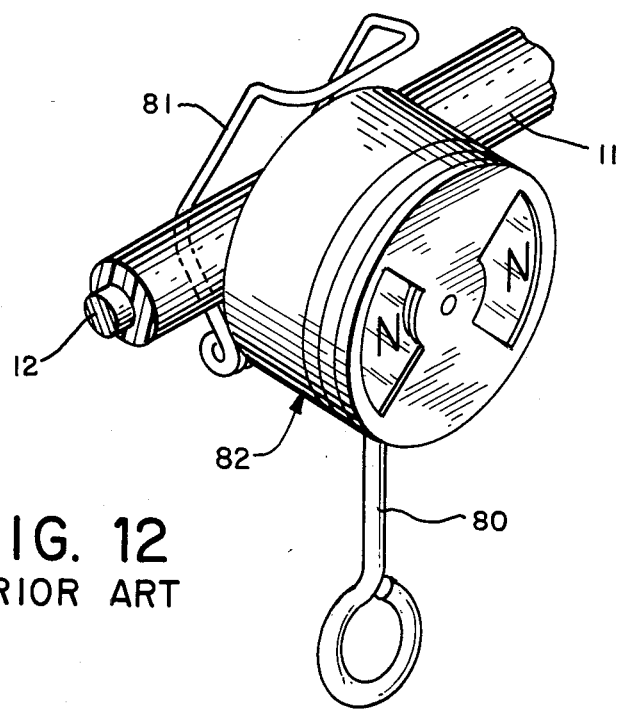
FIG. 12 is a perspective view of a prior art cable-mounted self-powered fault indicator utilizing a projecting electrically-conductive ground plane member of the type avoided by the present invention.

By reason of the highly effective electrostatic coupling provided to the electric field surrounding conductor 12 by the combination of plate 38 and conductive coating 45, and the high input impedance of the fault indicator circuitry, sufficient voltage is derived from the potential gradient around the conductor to obviate the need for external grounding connections or electrically conductive ground plane members projecting from the housing. Thus, the need for the projecting electrically-conductive element 80 and the electrically conductive wire clamp member 81 of the prior art fault indicator 82 illustrated in FIG. 12 is avoided, and a compact and efficient constructinn and packaging of the components of the indicator is provided within housing 16.

It will be appreciated that while the unique mounting and coupling arrangements of the invention have been shown in conjunction with a fault indicator, these arrangements may be utilized in conjunction with other types of devices, such as loss of voltage indicators and voltage level indicators.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A circuit condition monitoring device adapted for mounting on a monitored conductor to monitor a circuit condition associated with the conductor, comprising:

an elongated cylindrical hollow housing formed of non-electrically-conductive material;

high impedance circuit means within said housing operable from an applied alternating current for providing an output indicative of the circuit condition;

mounting means at one end of said housing for securing said housing in close proximity to said conductor;

first electrostatic coupling means comprising a first electrode entirely within said housing means at said one end thereof for providing a first interior pickup point electrically isolated from the exterior of said housing between said circuitry and the electric field surrounding said conductor;

second electrostatic coupling means comprising a second electrode generally annular in form and entirely within and concentric with said housing at the other end thereof for providing a second internal electrostatic pick-up point electrically isolated from the exterior of said housing between said circuitry and said electric field; and means for connecting said first and second electrodes to said circuit means to provide operating current thereto.

2. A circuit condition monitoring device as defined in claim 1 wherein said first electrode comprises a metallic plate positioned within and generally perpendicular to said housing between said one end and said high impedance circuit means.

3. A circuit condition monitoring device as defined in claim 1 wherein said second electrode comprises an electrically conductive ring having an outside diameter corresponding generally to the inside diameter of said housing.

4. A circuit condition monitoring device as defined in claim 3 wherein said ring is formed of a metallic material.

5. A circuit condition monitoring device as defined in claim 3 wherein said second electrode further comprises an electrically conductive coating on the inside of said housing in electrical communication with said electrically conductive ring.

* * * * *